United States Patent [19]

Stuyt

[11] Patent Number: 4,705,965
[45] Date of Patent: Nov. 10, 1987

[54] INTERFERENCE FREE D-TYPE FLIP-FLOP

[75] Inventor: Johannes J. Stuyt, Eindhoven, Netherlands

[73] Assignee: U.S. Philips Corporation, New York, N.Y.

[21] Appl. No.: 780,528

[22] Filed: Sep. 26, 1985

[30] Foreign Application Priority Data

Oct. 1, 1984 [NL] Netherlands .......................... 8402986

[51] Int. Cl.$^4$ ...................... H03K 3/26; H03K 3/284; H03K 21/16; H03K 19/094
[52] U.S. Cl. .................................... 307/279; 307/451; 307/481; 307/272.2; 377/117; 377/105
[58] Field of Search ........... 328/154; 307/279, 272 A, 307/481, 451; 377/117, 79, 105

[56] References Cited

U.S. PATENT DOCUMENTS

| | | | |
|---|---|---|---|
| 3,588,848 | 6/1971 | Van Beek | 307/279 |
| 3,812,384 | 5/1974 | Skorup | 307/279 |
| 4,250,406 | 2/1981 | Alaspa | 307/481 |
| 4,302,690 | 11/1981 | Gollinger et al. | 307/451 |
| 4,390,987 | 6/1983 | Best | 328/154 |
| 4,484,087 | 11/1984 | Mazin et al. | 377/105 |

Primary Examiner—Stanley D. Miller
Assistant Examiner—Trong Quang Phan
Attorney, Agent, or Firm—Robert T. Mayer; Bernard Franzblau

[57] ABSTRACT

An electronic D-type flipflop includes two storage elements and two transmission gates wherein each gate includes only one MOS transistor. In the first gate the MOS transistor is of a first conductivity type and it is of a second conductivity type in the second gate. The MOS transistors each receive the same clock signal at their gate electrode. Because it is not necessary to form an inverted clock signal, problems due to phase differences between the clock signal and its inverse are precluded. Each of the storage cells includes a pair of inverters which are coupled end-around. The transmission characteristic of the forward inverting circuit is adapted in such a way that it compensates for the voltage drop across the preceding transmission gate. Only a small substrate surface area will be required when the flipflop is used in an integrated circuit.

11 Claims, 3 Drawing Figures

INTERFERENCE FREE D-TYPE FLIP-FLOP

BACKGROUND OF THE INVENTION

This invention relates to an electronic flipflop circuit which includes a data input, a data output and a clock signal input, including a first transmission gate for transferring binary data on the data input to an input of a first storage element under the control of the clock signal, a second transmission gate for transferring, under the control of the clock signal, the binary data at an output of the first storage element to an input of a second storage element which includes an output which constitutes the data output, each transmission gate including only one insulated gate field effect transistor having a channel for the transfer of the binary data, both gate electrodes receiving the same clock signal and the transistor in the first transmission gate being of a first conductivity type, and the transistor in the second transmission gate being of a second conductivity type.

A circuit of this kind is known from U.S. Pat. No. 4,390,987 which describes a flipflop circuit in which a storage element is provided at its input with a transmission gate which consists of a single transistor, the storage element itself also including a single transmission gate. Each of the two transmission gates consists of only one insulated gate field effect transistor, the transistor in one gate being a P-type, while the transistor in the other gate is an N-type. These two gates alternately produce an input signal at the input of a forward inverter.

A transmission gate which includes a P-channel transistor distorts a "low" signal so that the voltage at the input of the forward inverter cannot become lower than the threshold voltage of the P-channel transistor, whereas the associated transmission gate (consisting of an N-channel transistor) distorts a "high" signal so that the voltage at the input of its forward inverter cannot become higher than the supply voltage minus the threshold voltage of this transistor.

These distortions render the flipflop circuit very susceptible to electrical interference signals in, for example, the power supply leads, notably in the case of low supply voltages (for example, 3 volts), as well as to tolerances in the manufacturing process and changes in the ambient conditions.

SUMMARY OF THE INVENTION

It is an object of the invention to provide a flipflop circuit which can operate with only one clock signal and which is less susceptible to electrical interference signals, tolerances in the manufacturing process and changes in the ambient conditions.

To achieve this, a flipflop circuit in accordance with the invention is characterized in that the storage elements include a forward and a reverse inverter, a first junction of an output of the reverse inverter and an input of the forward inverter constituting the input of the storage element, a second junction of an output of the forward inverter and an input of the reverse inverting circuit constituting the output of this storage element, the change-over point or voltage of the forward inverter in at least one storage element deviating from the mean value of the two logic output levels of said circuit by an at least substantial part of the logic voltage step, the change-over point being higher than said means value when the transmission gate at the input of the storage element includes a P-type field effect transistor and being lower when the transmission gate includes an N-type field effect transistor.

The use of only one transmission gate per storage element allows for adaptation of the transmission characteristic of the forward inverter to the type of field effect transistor included in the transmission gate.

Such a circuit also offers the advantage that the transmission gates are controlled by one and the same clock signal: when the MOST in the first transmission gate is turned on, the MOST in the second gate is turned off (and vice versa). Consequently, phase differences of the kind occuring between the clock signals in flipflops comprising a PMOST as well as an NMOST in a transmission gate are precluded.

BRIEF DESCRIPTION OF THE DRAWING

An embodiment in accordance with the invention will be described in detail hereinafter with reference to the accompanying drawing, wherein.

DETAILED DESCRIPTION OF THE PREFERRED EMBODIMENTS

Figure 1:
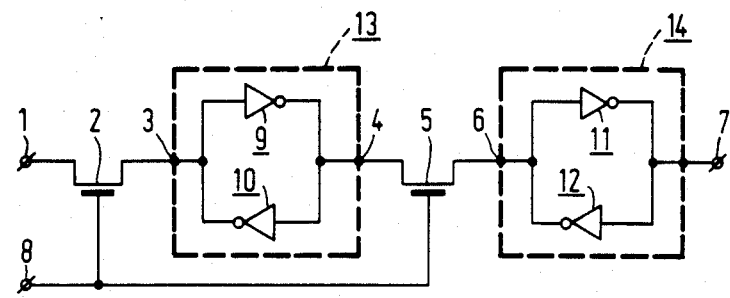
FIG. 1 shows a D-type flipflip circuit in accordance with the invention.

FIG. 1 shows D-type flipflop circuit in accordance with the invention. It comprises a clock signal input (8), a data input (1), a first transmission gate which includes a PMOST (2), a first storage element (13), a second transmission gate which includes an NMOST (5), and a second storage element (14) which includes a data output (7). Each of the storage elements (13 and 14, respectively) includes an input (3 and 6, respectively), an output (4 and 7, respectively), a forward inverter (9 and 11, respectively) and a reverse inverter (10 and 12, respectively).

When the clock signal is "0" (for example, 0 Volts), the PMOST (2) is turned on and the NMOST (5) is turned off. The binary data on the data input is transferred to the first storage element (13) via the first transmission gate: its output (4) assumes the inverse value. The second storage element (14) remains in the same state. When the clock signal changes over from "0" to "1" (for example, 5 Volts), the PMOST (2) is turned off and the NMOST (5) is turned on. The state of the first storage element is then latched and transferred to the second storage element via the NMOST (5). The data output (7) assumes the binary value present on the input (3) of the first storage element when the last clock signal transition occured.

Figure 2:
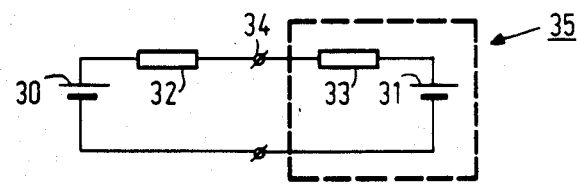
FIG. 2 shows an electrical equivalent diagram at the input of a storage element.

FIG. 2 shows an electrical equivalent diagram at the input (34) of the storage element (35) at the instant at which the transmission gate starts to conduct. Voltage source 31 has a value which corresponds to the logic level on the input before the transmission gates starts to conduct. When the input resistance of the inverters is high with respect to their output resistance, the internal resistance (33) of the input (34) of the storage element will be equal to the internal resistance of the reverse inverter.

The resistance (32) is formed by the series connection of the MOST in the transmission gate and the output resistance of the controlling circuit. When the controlling circuit is a storage element, the resistance (32) is determined by the series connection of the transmission gate and the forward inverting circuit in the controlling storage element. The value of the voltage source (30) is determined by the logic level to be transferred and the type of conductivity of the MOST in the transmission gate. When the transmission gate includes a PMOST, the voltage source (30) has the value $V_{THP}$ (the threshold voltage of the PMOST) or +5 V when a "0" and a "1" are transferred, respectively. For a transmission gate including an NMOST, these values are 0 V and 5 V $-V_{THN}$, respectively (the threshold voltage of the NMOST). Assume the value of the threshold voltages to be 1 Volt (a customary value in integrated circuits). It appears from the eqiuvalent diagram that the internal resistance of the transmission gate must be low in order to ensure suitable transmission and that the internal resistance of the output of the reverse inverter must be higher than the internal resistance of the output of the forward inverter. When a "1" is transmitted by a transmission gate having an N-channel transistor, the voltage source (30) has a value of 4 Volts. Because this voltage must be sufficient to control the forward inverter in the storage element (35), the change-over point of this circuit must be chosen to be below the mean value of the logic levels. When the transmission gate includes a PMOST, the change-over point must be chosen to be higher than said mean value. The absolute difference between the change-over point and the mean value of the logic levels must be more than 10% of the logic voltage step. It has been found that a difference of 20% provides acceptable results. The adaptation of the internal resistances in the storage elements to one another and the adaptation of the change-over point to the transmission gate result in a circuit which is less susceptable to supply voltage fluctuations and manufacturing process tolerances. Moreover, the switching times are shorter.

Figure 3:
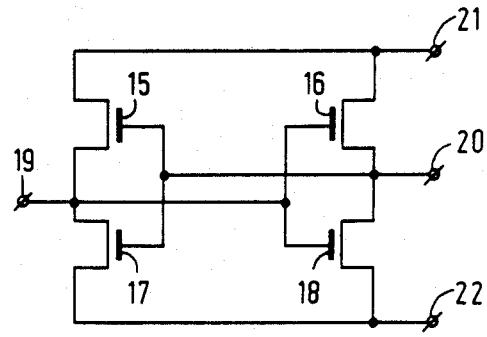
FIG. 3 shows a preferred embodiment of a storage element.

FIG. 3 shows a preferred embodiment of a storage element. The circuit includes insulated gate complementary field effect transistors (CMOS).

The forward inverter includes a PMOST (16) and an NMOST (18). The output and the input of this circuit are formed by the junctions 20 and 19, respectively, which also form the output and the input, respectively, of the storage element. The reverse inverter whose output and input are formed by the junctions 19 and 20, respectively, also includes a PMOST (15) and an NMOST (17). The supply terminals 21 and 22 carry a constant voltage which corresponds to a logic "1" level and a logic "0" level, respectively (5 V and 0 V, respectively). This circuit does not dissipate power in the static state. The input resistances of the inverters are extremely high.

It appears from the description given with reference to FIG. 2 that this is an important advantage. The output resistance of the inverter is determined by the conductivity factors of the PMOS and NMOS transistors. The conductivity factor of a MOS transistor is proportional to the quotient of the width and the length of the channel. The change-over point of such an inverting circuit can be simply influenced: when the conductivity factor of the PMOST is higher than that of the NMOST, the change-over point will be higher than the mean value of the supply voltages; when the conductivity factor of the PMOST is lower, the change-over point will be lower than said mean value.

Simulations have demonstrated that, in order to achieve said differences of 10% and 20%, the ratio of the conductivity factors of the PMOST and the NMOST must be between two and five when a transmission gate including a P-channel transistor is connected to the input of the storage element, and that the ratio must be between one fifth and one half when the transmission gate includes an N-channel transistor.

A D-type flipflop of the described kind is particularly suitable for use in an integrated CMOS circuit. A computer simulator has demonstrated that such a D-type flipflop continues to operate correctly with a clock frequency of 80 MHz. The substrate surface area occupied by this flipflop, consisting of only ten transistors, amounts to only 3500 $\mu m^2$.

What is claimed is:

1. An electronic flipflop circuit comprising: a data input, a data output, a clock signal input, a first transmission gate for transferring binary data appearing on the data input to an input of a first storage element under the control of a clock signal at the clock signal input, a second transmission gate for transferring, under the control of the clock signal, binary data appearing on an output of the first storage element to an input of a second storage element having an output which constitutes said data output, each transmission gate including only one insulated gate field effect transistor having a channel serving for the transfer of the binary data, gate electrodes of said transistors in the transmission gates receiving the same clock signal, the transistor in the first transmission gate being of a first conductivity type and the transistor in the second transmission gate being of a second conductivity type, wherein the storage elements each include a forward and a reverse inverter coupled together so that a first junction of an output of the reverse inverter and an input of the forward inverter form the input of the storage element and a second junction of an output of the forward inverter and an input of the reverse inverter form the output of the storage element, the forward inverter in at least one storage element having a change-over voltage which deviates from a mean value of two logic output levels of said circuit by at least 10 percent of a logic voltage step, the change-over voltage being higher than said mean value for a transmission gate at the input of the storage element which includes a P-type field effect transistor, and being lower for a transmission gate that includes an N-type field effect transistor.

2. An electronic flip-flop circuit as claimed in claim 1, characterized in that the inverters in at least one storage element comprise: a first insulated gate field effect transistor having a P-type channel coupled between a first supply terminal and the output of the inverter, and a second insulated gate field effect transistor having an N-type channel coupled between the output of the inverter and a second supply terminal, a junction of the gate electrodes of the first and the second insulated gate field effect transistors constituting the input of the inverter, the ratio of the conductivity factors of the first and the second insulated gate field effect transistor in the forward inverter being between two and five when the transmission gate at the input of said storage element includes a P-channel insulated gate field effect transistor, said ratio being between one fifth and one half when said insulated gate field effect transistor includes an N-type channel.

3. An electronic flip-flop circuit as claimed in claim 1 wherein the change-over voltage of a forward inverter in at least one storage element deviates from the mean value of the two logic output levels of said circuit by 20 percent of the logic voltage step at the output.

4. A flip-flop circuit comprising: a first signal transmission gate, a first storage element, a second signal transmission gate, a second storage element, means connecting said first signal transmission gate, said first storage element, said second signal transmission gate and said second storage element in cascade, in the order named, between a binary data input terminal and a binary data output terminal, each of said gates comprising a single FET with each FET having a gate electrode connected to a common clock signal input terminal, said transmission gate FETs being of opposite conductivity types, each storage element comprising a forward inverter and a reverse inverter coupled together so that an input of each inverter is connected to an output of the other inverter, the forward inverter of at least one of said storage elements having a trip voltage that deviates from a mean value of two logic output voltage levels of the circuit by at least 10 percent of a logic voltage step at the output, said trip voltage being higher than said mean value where the transmission gate at the input of said storage element includes a P-type FET and being lower than said mean value where the input transmission gate includes an N-type FET.

5. A flip-flop circuit as claimed in claim 4 wherein the trip voltage voltage of a forward inverter in at least one storage element deviates from the mean value of the two logic output levels of said circuit by approximately 20 percent of the logic voltage step at the output.

6. A flip-flop circuit as claimed in claim 4 wherein at least one of said storage elements comprises: a forward inverter including first and second FETs of opposite conductivity types serially connected between first and second voltage supply terminals, a reverse inverter including third and fourth FETs of opposite conductivity types serially connected between said first and second voltage supply terminals, and means connecting a gate electrode of the first and second FETs together and a gate electrode of the third and fourth FETs together to form first and second input points for said forward and reverse inverters, respectively, a junction between said first and second FETs forming an output terminal of the forward inverter.

7. A flip-flop circuit as claimed in claim 6 wherein the ratio of the conductivity factors of the first and second FETs of the forward inverter lie in the range between two and five where the FET of the transmission gate at the input of the storage element comprises a P-type channel FET.

8. A flip-flop circuit as claimed in claim 6 wherein the ratio of the conductivity factors of the first and second FETs of the forward inverter lie in the range between 1/5 and ½ where the FET of the transmission gate at the input of the storage element comprises an N-type channel FET.

9. A flip-flop circuit as claimed in claim 4 wherein the input of each inverter is directly connected to the output of the other inverter in at least one of said storage elements.

10. A flip-flop circuit as claimed in claim 5 wherein for at least one storage element the output of the reverse inverter is directly connected to the input of the forward inverter.

11. An electronic flip-flop circuit as claimed in claim 1 wherein said first junction of the storage elements comprise a substantially zero ohmic direct connection between said output of the reverse inverter and said input of the forward inverter.

* * * * *